(12) United States Patent
Lou et al.

(10) Patent No.: US 8,460,428 B2
(45) Date of Patent: Jun. 11, 2013

(54) SINGLE-CRYSTALLINE METAL NANORINGS AND METHODS FOR SYNTHESIS THEREOF

(75) Inventors: Jun Lou, Houston, TX (US); Yongjie Zhan, Houston, TX (US)

(73) Assignee: William Marsh Rice University, Houston, TX (US)

( * ) Notice: Subject to any disclaimer, the term of this patent is extended or adjusted under 35 U.S.C. 154(b) by 428 days.

(21) Appl. No.: 12/771,629

(22) Filed: Apr. 30, 2010

(65) Prior Publication Data

US 2010/0279128 A1 Nov. 4, 2010

Related U.S. Application Data (60) Provisional application No. 61/174,047, filed on Apr. 30, 2009.

(51) Int. Cl.
*B22F 9/24* (2006.01)
*B82Y 40/00* (2006.01)

(52) U.S. Cl.
USPC .............................. 75/371; 75/373; 977/896

(58) Field of Classification Search
None
See application file for complete search history.

(56) References Cited

U.S. PATENT DOCUMENTS

| 8,216,635 | B2 * | 7/2012 | Song et al. ................... 427/98.4 |
| 2006/0084278 | A1 * | 4/2006 | Winter et al. .................. 438/777 |
| 2008/0003576 | A1 * | 1/2008 | Zhang et al. ....................... 435/6 |
| 2009/0176875 | A1 * | 7/2009 | Kim et al. ...................... 514/494 |

FOREIGN PATENT DOCUMENTS
WO WO-2008/021604 A2 * 2/2008

OTHER PUBLICATIONS

Gong, et al., "Synthesis of copper/cross-linked poly(vinyl alcohol) (PVA) nanocables via a simple hydrothermal route", J. Mater. Chem., 16:2006, pp. 101-105.
Luo, et al., "Large-Scale Fabrication of Flexible Silver/Cross-Linked Poly(vinyl alcohol) Coaxial Nanocables by a Facile Solution Approach", J. Am. Chem. Soc., 127:2005, pp. 2822-2823.
Qian, et al., "Te@Cross-Linked PVA Core—Shell Structures Synthesized by a One-Step Synergistic Soft—Hard Template Process", Crystal Growth & Design, 6:2006, pp. 607-611.
Liu, et al., "Synthesis of Copper Nanowires via a Complex-Surfactant-Assisted Hydrothermal Reduction Process", J. Phys. Chem. B, 107:2003, pp. 12658-12661.
Shi, et al., "Obtaining ultra-long copper nanowires via a hydrothermal process", Sci. Tech. Adv. Mater., 6:2005, pp. 761-765.
Chang, et al., "Large-Scale Synthesis of High-Quality Ultralong Copper Nanowires", Langmuir, et al., 21:2005, pp. 3746-3748.

* cited by examiner

*Primary Examiner* — George Wyszomierski
(74) *Attorney, Agent, or Firm* — Winstead PC (57) ABSTRACT

In various embodiments, methods for synthesizing single-crystalline zero-valent metal nanorings, such as single-crystalline copper nanorings, are described herein. The methods include providing a solution containing a metal cation, a complexing agent bound to the metal cation, thereby forming a metal complex that is at least partially soluble in the solution, and a reducing agent operable for reducing the metal complex to a zero-valent metal and then heating the solution for a sufficient time and at a sufficient temperature until zero-valent metal nanorings form. The solution may be an aqueous solution in an embodiment. Single-crystalline metal nanorings produced by the methods described herein may have a diameter less than about 100 μm and a wall thickness between about 10 nm and about 500 nm.

24 Claims, 4 Drawing Sheets

FIG. 9

SINGLE-CRYSTALLINE METAL NANORINGS AND METHODS FOR SYNTHESIS THEREOF

CROSS-REFERENCE TO RELATED APPLICATIONS

This application claims priority to U.S. Provisional Patent Application 61/174,047, filed Apr. 30, 2009, which is incorporated by reference in its entirety herein.

STATEMENT REGARDING FEDERALLY SPONSORED RESEARCH

This invention was made with Government support under grant number ECCS 0702766 awarded by the National Science Foundation, grant number FA8650-07-2-5061 awarded by the Air Force Research Laboratory and grant number FA9550-09-1-0084 awarded by the Air Force Office of Scientific Research. The Government has certain rights in the invention.

BACKGROUND

In recent years, substantial research interest has been directed toward nano scale structures due to the unique properties that are observed at the nanoscale. Common nanoscale structures include nanoparticles, nanowires, and nanotubes, for example. Metallic nanowires, particularly copper nanowires, for example, have drawn considerable interest for their potential use in nanoelectrical and nanomechanical devices due to the high thermal and electrical conductivity of bulk copper.

Methods for synthesizing nanoscale structures can be divided into template-assisted methods and template-free methods. Illustrative template-free methods include chemical vapor deposition, vapor-solid reaction growth, solid-phase electrochemical deposition, physical vapor vacuum deposition, irradiation methods, thermal-assisted photoreduction methods and liquid-phase reduction methods. All but the liquid-phase reduction methods, including hydrothermal and solvothermal syntheses, typically produce polycrystalline material. In contrast, liquid-phase reduction methods can, under suitable conditions, produce single-crystalline nanowires having high aspect ratios in good yield.

Although the aforementioned nanoscale structures have been the subject of a majority of current research activities, other nanoscale structures also remain of considerable interest. Nanorings or nanobelts, in particular, are an especially intriguing nanoscale material having a closed loop structure that may be of potential commercial relevance. Such nanorings may have special properties, including novel optical and magnetic properties, that are not duplicated by the bulk materials themselves. Further, since the nanorings have a closed loop structure, the interior portion of the nanorings may be used to contain molecules in a semi-isolated environment. Although nanorings are a nanoscale structure of considerable interest, their synthesis remains very difficult. Synthesis of single-crystalline nanorings is an especially daunting task. In one of the very few successful efforts at synthesizing single-crystalline nanorings, ZnO nanorings have been prepared by a high temperature vapor deposition process. Metallic gold and silver nanoring structures are also known, albeit in polycrystalline form. Single-crystalline metal nanoring structures are presently unknown.

In view of the foregoing, efficient methods to prepare metal nanorings, particularly single-crystalline metal nanorings, would be of considerable benefit in the art. Facile syntheses of single-crystalline metal nanorings would further expand the realm of potential commercial applications for these nanomaterials.

SUMMARY

In various embodiments, the present disclosure describes methods for synthesizing zero-valent metal nanorings. The methods include providing a solution containing a metal cation, a complexing agent bound to the metal cation and a reducing agent operable for reducing the metal cation to a zero-valent metal and then heating the solution for a sufficient time and at a sufficient temperature until zero-valent metal nanorings form. The complexing agent makes the metal cation at least partially soluble in the solution.

In other various embodiments, solvothermal methods for synthesizing single-crystalline zero-valent metal nanorings are described herein. The methods include providing an aqueous solution containing water, a metal cation, a complexing agent bound to the metal cation thereby forming a metal complex and a reducing agent operable for reducing the metal complex to a zero-valent metal upon being heated. The methods further include heating the aqueous solution for a sufficient time and at a sufficient temperature until single-crystalline zero-valent metal nanorings form. The metal complex is at least partially soluble in the solution. Reduction of the metal complex takes place during at least a portion of the time that heating occurs.

In yet other embodiments, solvothermal methods for synthesizing single-crystalline copper nanorings are described herein. The methods include providing an aqueous solution containing water, a Cu (I) salt containing a Cu (I) cation, NMP complexed to the Cu (I) cation to form a Cu (I)-NMP complex that is at least partially soluble in the aqueous solution, and a reducing agent operable for reducing the Cu (I)-NMP complex to copper metal upon being heated. The methods further include heating the aqueous solution for a sufficient time and at a sufficient temperature until single-crystalline copper nanorings form. Reduction of the Cu (I)-NMP complex takes place during at least a portion of the time that heating occurs.

In still other various embodiments, single-crystalline zero-valent metal nanorings prepared by the various methods set forth herein are described.

The foregoing has outlined rather broadly the features of the present disclosure in order that the detailed description that follows may be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

In the following description, certain details are set forth such as specific quantities, sizes, etc. so as to provide a thorough understanding of the present embodiments disclosed herein. However, it will be evident to those of ordinary skill in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

Referring to the drawings in general, it will be understood that the illustrations are for the purpose of describing particular embodiments of the disclosure and are not intended to be limiting thereto. Drawings are not necessarily to scale.

While most of the terms used herein will be recognizable to those of ordinary skill in the art, it should be understood, however, that when not explicitly defined, terms should be interpreted as adopting a meaning presently accepted by those of ordinary skill in the art. In cases where the construction of a term would render it meaningless or essentially meaningless, the definition should be taken from Webster's Dictionary, 3rd Edition, 2009. Definitions and/or interpretations should not be incorporated from other patent applications, patents, or publications, related or not, unless specifically stated in this specification or if the incorporation is necessary for maintaining validity.

"Complexing agent," as used herein, refers to a ligand operable for binding to a metal. The terms complexing agent and ligand will be used synonymously in the discussion that follows.

"Metal nanorings," as used herein, refer to metal nanostructures having a closed-loop form. As used in the discussion that follows, metal nanorings will refer to any closed-loop metal nanostructure that is approximately circular, elliptical, or irregularly-shaped.

"Solvothermal," as used herein, refers to high-temperature methods for synthesizing a material that are conducted at a temperature above the normal boiling point for a given solvent.

In various embodiments, the present disclosure describes methods for synthesizing zero-valent metal nanorings. The methods include providing a solution containing a metal cation, a complexing agent bound to the metal cation and a reducing agent operable for reducing the metal cation to a zero-valent metal and then heating the solution for a sufficient time and at a sufficient temperature until zero-valent metal nanorings form. The complexing agent makes the metal cation at least partially soluble in the solution. In some embodiments, the zero-valent metal nanorings are single-crystalline.

Solutions used for synthesizing zero-valent metal nanorings according to various described herein may include inorganic solvents, organic solvents and any mixture thereof. Inorganic solvents may include, for example, water, liquid ammonia, liquid sulfur dioxide, supercritical carbon dioxide, liquid hydrogen fluoride, sulfuric acid, and inorganic mineral acids (e.g., hydrofluoric, hydrochloric, hydrobromic and hydroiodic acid). Other inorganic solvents may include, for example, phosphorus oxychloride, antimony pentafluoride, antimony pentachloride, titanium tetrachloride, thionyl chloride, and combinations thereof. One of ordinary skill in the art will recognize that many of these inorganic solvents are moisture sensitive, and the precautions should be taken to exclude or substantially limit exposure of the solution to moisture when these inorganic solvents are present. Organic solvents may include, for example, aliphatic hydrocarbons (e.g., alkanes, alkenes, alkynes and cyclic versions thereof), aromatic hydrocarbons (e.g., benzene, toluene and xylenes), ethers (e.g., diethyl ether, tetrahydrofuran), carboxylic acids, esters, amides, amines, ketones and halogenated solvents (e.g., $CH_2Cl_2$, $CHCl_3$ and $CCl_4$). Organic solvents may also include high-boiling organic solvents having donor atoms capable of serving as ligands including, for example, dimethylsulfoxide, dimethylformamide, dimethylacetamide, N-methylpyrrolidone, 2-pyrrolidone, pyrrole, thiophene, pyridine, collidine, acetonitrile, benzonitrile, dimethylpropyleneurea, hexamethylphosphoramide, and phosphines (e.g., trimethylphosphine and tributylphosphine). One of ordinary skill in the art will recognize that the organic solvents of the latter listing contain donor atoms that are capable of at least partially solvating metal ions by forming a metal complex. In some embodiments, organic solvents used in the solutions described herein may be an ionic liquid such as, for example, 1-butyl-3-methylimidazolium hexafluorophosphate, 1-ethyl-3-methylimidazolium dicyanamide, and 1-butyl-3,5-dimethylpyridinium bromide. In some embodiments, the solvent may be a solid at room temperature but form a liquid upon being heated when used in the various methods described herein. The aforesaid listings of solvents have been provided for illustrative purposes only and should not be considered to be limiting of the scope of the present disclosure.

In some embodiments, solutions used for synthesizing zero-valent metal nanorings according to the methods described herein are aqueous solutions including at least water. In some embodiments, the solutions are organic solutions including at least one organic solvent. In still other embodiments, the solutions are aqueous solutions containing at least water and at least one organic solvent. In some embodiments, at least one solvent of the solution may also coordinate or complex a metal ion in the various methods described herein.

In various embodiments, complexing agents of the present disclosure are operable for forming at least one metal-ligand bond to the metal cations used in the various methods described herein, thereby forming a metal complex. In some embodiments, complexing agents may be organic solvents including, without limitation, dimethylsulfoxide, dimethylformamide, dimethylacetamide, N-methylpyrrolidone, N-vinylpyrrolidone, 2-pyrrolidone, N-methyl-2-piperidone, 2-piperidone, pyrrole, thiophene, pyridine, collidine, acetonitrile, benzonitrile, dimethylpropyleneurea, hexamethylphosphoramide, and phosphines (e.g., trimethylphosphine and tributylphosphine). Other compounds containing donor atoms that may form at least one metal-ligand bond in a metal complex may include, for example, ammonia, amines (e.g., methylamine, dimethylamine, triethylamine), sulfur-containing ligands (e.g., thiols) and chelating ligands (e.g., chelating phosphine ligands, salen ligands, ethylenediamine and other nitrogen-containing chelating ligands). The aforesaid listings of complexing agents have been provided for illustrative purposes only and should not be considered to be limiting of the scope of the present disclosure. In some embodiments of the present disclosure, the complexing agent is N-methylpyrrolidone (NMP).

In embodiments of the present disclosure, reducing agents are operable for reducing metal cations or metal complexes to a zero-valent metal. In some embodiments, the reducing agent is poly(vinyl alcohol) (PVA). In such embodiments, the metal cation is reduced to a zero-valent metal and at least a portion of the alcohol groups in the PVA become oxidized to ketones. In some embodiments, the PVA becomes cross-linked in the process of reducing the metal cations or metal complexes. Advantages of PVA in the present methods for synthesizing zero-valent metal nanorings are discussed hereinafter. In some embodiments of the present disclosure, the reducing agent may be a high molecular weight alcohol such as, for example, cetyl alcohol or a polyol such as, for example, sugars or glycerol. In some embodiments, the reducing agent is operable for reducing the metal cation or metal complex upon being heated.

One of ordinary skill in the art will recognize PVA to be particularly advantageous as a reducing agent in the present methods due to its high concentration of oxidizable alcohol groups per unit weight. Further, PVA's high melting point and high-temperature stability is advantageous in the solvothermal methods described herein. Still further, in various embodiments of the present methods, the PVA may become cross-linked in the process of reducing the metal cations or metal complexes and thereafter coat the surface of the zero-valent metal nanorings produced. Such coatings may stabilize and aid in the formation of zero-valent metal nanorings in various embodiments of the present disclosure. In the various embodiments described herein, PVA having an average molecular weight range of 13000-23000 has been used. However, the PVA molecular weight range is not believed to be particularly critical, and PVA having any desired molecular weight range may be used in the various embodiments described herein. In some embodiments, the PVA may have an average molecular weight range of about 13000 to about 23000, or about 31000 to about 50000, or about 89000 to about 98000, or about 85000 to about 124000, or about 146000 to about 186000.

In various embodiments, a sufficient temperature for synthesizing zero-valent metal nanorings ranges from about 50° C. to about 500° C. In some embodiments, the temperature may range from about 100° C. to about 300° C., or from about 100° C. to about 250° C., or from about 150° C. to about 300° C., or from about 150° C. to about 250° C. or from about 175° C. to about 225° C. or from about 180° C. to about 210° C. Working temperature ranges may be dictated by an effective stability range of the solvent and/or the heating vessel used for synthesizing the zero-valent metal nanorings. For example, in the examples presented hereinbelow, an effective upper working limit of the autoclave used for heating was about 210° C. Formation of the zero-valent metal nanorings is typically favored by higher working temperatures.

In various embodiments, a sufficient time for synthesizing zero-valent metal nanorings is typically less than about 7 days. In some embodiments, the synthesis time may be less than about 5 days, or less than about 4 days, or less than about 3 days, or less than about 2 days, or less than about 1 day. One of ordinary skill in the art will recognize that the synthesis time may also be a function of reaction temperature.

In some embodiments of the present disclosure, the zero-valent metal nanorings are copper nanorings. According to some embodiments of the present disclosure, the metal cation is a Cu (I) salt. In some embodiments, the Cu (I) salt may be, for example, CuCl, CuBr, CuI or CuCN. In some embodiments, a Cu (I) salt may be formed in situ from a higher-valence copper salt. For example, in an embodiment, Cu (I) may be formed in situ from Cu (II) via comproportionation, reduction with another metal or via sulfite-mediated reduction.

Figure 1A:
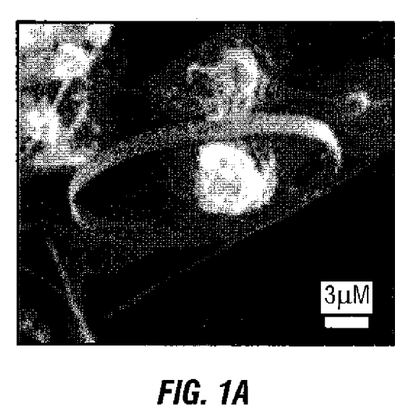
FIGS. 1A and 1B show illustrative SEM images on a vertically-aligned carbon nanotube substrate of single-crystalline copper nanorings produced according to embodiments of the present disclosure.
Figure 1B:
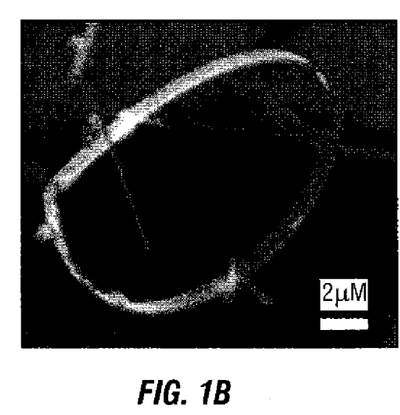

In some of the embodiments described herein for preparing copper nanorings, the metal cation is a Cu (I) salt, the complexing agent is NMP and the reducing agent is PVA. FIGS. 1A and 1B show illustrative SEM images on a vertically-aligned carbon nanotube substrate of single-crystalline copper nanorings produced according to such embodiments of the present disclosure.

In various embodiments, solvothermal methods for synthesizing single-crystalline zero-valent metal nanorings are described herein. The methods include providing an aqueous solution containing water, a metal cation, a complexing agent bound to the metal cation thereby forming a metal complex that is at least partially soluble in the solution, and a reducing agent operable for reducing the metal complex to a zero-valent metal upon being heated. The methods further include heating the aqueous solution for a sufficient time and at a sufficient temperature until zero-valent single-crystalline metal nanorings form. Reduction of the metal complex takes place during at least a portion of the time that heating occurs.

In some embodiments of the solvothermal methods, the metal cation is a monovalent transition metal cation. Such monovalent transition metal cations may include any metal from groups 3 through 12 of the periodic table capable of forming a monovalent oxidation state. For example, in some embodiments, the monovalent transition metal cation is Cu (I) and the single-crystalline zero-valent metal nanorings are copper nanorings. In such embodiments, the metal cation may be part of a Cu (I) salt such as, for example, CuCl, CuBr, CuI or CuCN. In some embodiments, the reducing agent is PVA. In some embodiments, the complexing agent is NMP. In some embodiments for synthesizing single-crystalline copper nanorings, the metal cation is a Cu (I) salt, the complexing agent is NMP, and the reducing agent is PVA. In embodiments in which PVA is the reducing agent, cross-linked PVA may coat the single-crystalline zero-valent metal nanorings.

In some embodiments of the solvothermal methods, the sufficient temperature for synthesizing single-crystalline zero-valent metal nanorings is between about 180° C. and about 210° C. In other embodiments of the solvothermal methods, a sufficient time for synthesizing single-crystalline zero-valent metal nanorings is less than about 7 days.

In some embodiments, the single-crystalline zero-valent metal nanorings of the present disclosure have diameters less than about 100 µm. In other embodiments, the single-crystalline zero-valent metal nanorings have diameters less than about 50 µm. In still other embodiments, the single-crystalline zero-valent metal nanorings have diameters between about 1 µm and about 100 µm, or between about 5 µm and about 80 µm, or between about 10 µm and about 60 µm, or between about 30 µm and about 60 µm, or between about 40 µm and about 60 µm. As used herein, diameters for non-circular structures refer to an averaged distance across the single-crystalline zero-valent metal nanoring structure. For example, when the single-crystalline zero-valent metal nanorings are approximately elliptical, diameter may be calculated by averaging the length of the major and minor axes of the ellipse.

In some embodiments, the single-crystalline zero-valent metal nanorings have a wall thickness between about 10 nm about 500 nm. As used herein wall thickness refers to the difference in thickness between the outer diameter and inner diameter of the single-crystalline zero-valent metal nanorings. In other embodiments, the single-crystalline zero-valent metal nanorings may have a wall thickness between about 10 nm and about 100 nm, or between about 100 nm and about 500 nm, or between about 50 nm and about 300 nm, or between about 50 nm and about 400 nm, or between about 100 nm and about 300 nm.

In still more specific embodiments, solvothermal methods for synthesizing single-crystalline copper nanorings are described herein. The methods include providing an aqueous solution containing water, a Cu (I) salt containing a Cu (I) cation, NMP complexed to the Cu (I) cation to form a Cu (I)-NMP complex that is at least partially soluble in the aqueous solution, and a reducing agent operable for reducing the Cu (I)-NMP complex to copper metal upon being heated. The methods further include heating the aqueous solution for a sufficient time and at a sufficient temperature until single-crystalline copper nanorings form. Reduction of the Cu (I)-NMP complex takes place during at least a portion of the time that heating occurs. In some embodiments, the reducing agent is PVA. In some embodiments, the PVA is cross-linked and forms a coating on the single-crystalline zero-valent metal nanorings.

In some embodiments, a sufficient temperature for synthesizing single-crystalline copper nanorings by the aforementioned methods is between about 180° C. and about 210° C. In some embodiments, a sufficient time for synthesizing single-crystalline copper nanorings by the aforementioned methods is less than about 7 days. However, as described previously, other temperatures and reaction times lie within the spirit and scope of the present disclosure.

In some embodiments, the single-crystalline copper nanorings have diameters less than about 100 µm. In some or other embodiments, the single-crystalline copper nanorings have a wall thickness between about 10 nm and about 500 nm. In some embodiments, the single-crystalline copper nanorings are approximately circular. In some embodiments, the single-crystalline copper nanorings are approximately elliptical. In some embodiments, the single-crystalline copper nanorings are irregularly-shaped closed-loop structures.

Without being bound by theory or mechanism, Applicants believe that the present methods for synthesizing single-crystalline copper nanorings and other single-crystalline zero-valent metal nanoring structures proceed through a non-templated growth mechanism. In most template-assisted nanostructure growth techniques, nucleation and growth of nanoparticles takes place along the template at the same time to produce a polycrystalline structure. The fact that the present zero-valent metal nanorings are single-crystalline argues against a template-assisted growth mechanism. According to Applicants' current understanding of the growth mechanism, the formation of single-crystalline zero-valent metal nanorings is grounded upon bending and ring closure of single-crystalline zero-valent metal nanowires. The fact that the single-crystalline zero-valent metal nanorings often include an irregularity or cusp on their outer surface suggests a point of ring closure for formation of a closed structure from a curved nanowire.

Figure 2:
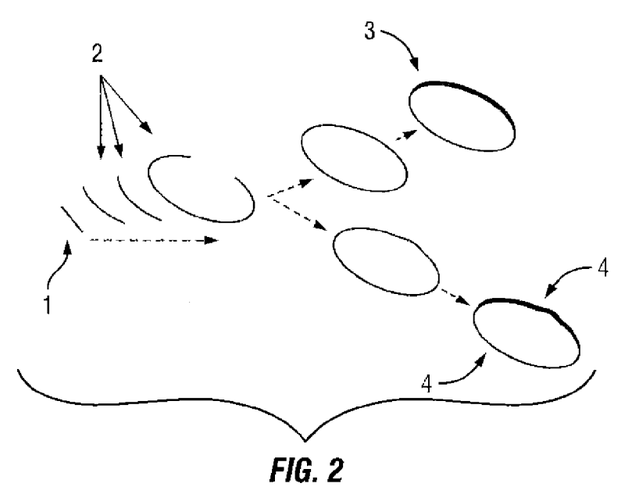
FIG. 2 shows a proposed but non-limiting growth mechanism for single-crystalline zero-valent metal nanorings.

A proposed but non-limiting growth mechanism for single-crystalline zero-valent metal nanorings is shown in FIG. 2. As shown in FIG. 2, zero-valent metal nanowire 1 is formed as a single-crystalline, linear structure that gradually grows into bent zero-valent metal nanowires 2 of increasing length. Eventually, the free ends of bent zero-valent metal nanowires 2 meet to form a zero-valent metal nanoring. If the joining free ends of bent zero-valent metal nanowires 2 exactly meet in a head-to-tail fashion, then circular zero-valent metal nanorings 3 are formed. If the joining free ends of bent zero-valent metal nanowires 2 instead meet in a head-to-tail fashion in which there is overlap between the head and the tail, then irregular, water-droplet type zero-valent metal nanorings 4 are formed. Irregular, water-droplet type zero-valent metal nanorings 4 are characterized by a cusp 4' where the free ends overlap in the joining process. In either case of circular zero-valent metal nanorings 3 or irregular, water-droplet type zero-valent metal nanorings 4, continued deposition of the zero-valent metal seals the joint between the free ends and closes the nanoring structure. After the zero-valent metal nanorings have closed, their wall thickness may continue to increase through ongoing deposition of zero-valent metal. Again without being bound by theory or mechanism, Applicants believe that bending of zero-valent metal nanowire 1 may result from induced stress originating from a cross-linked PVA coating on the zero-valent metal nanowires or from non-uniform zero-valent metal nanowire growth resulting from a local ion concentration gradient. Such induced stress bending is consistent with the proposed template-free formation of single-crystalline zero-valent metal nanorings. Further, the fact that single-crystalline metal nanowires are co-produced with the presently described single-crystalline zero-valent metal nanorings provides evidence for the intermediacy of nanowires in the formation of nanorings.

Figure 3:
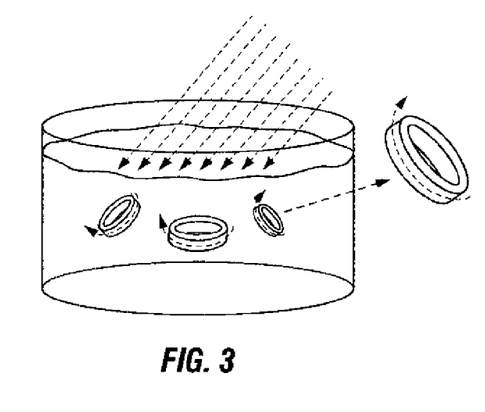
FIG. 3 shows an illustrative schematic of single-crystalline zero-valent metal nanorings dispersed in a liquid being exposed to an alternating magnetic field and so inducing current flow in the nanoring structure.

Single-crystalline zero-valent metal nanorings produced by the methods described herein may potentially find utility in a number of applications. For example, in the quasi-static limit, an alternating magnetic field may induce current flow in such a closed-loop metal nanoring, which in turn results in a local magnetic dipole moment. The magnetic dipole moment so generated may be beneficially used in a number of applications such as, for example, wireless Joule heaters, artificial muscle, electromagnetic fluid nanosensors, antennas, and curved wave guides for nanooptical applications. FIG. 3 shows an illustrative schematic of single-crystalline zero-valent metal nanorings dispersed in a liquid being exposed to an alternating magnetic field and so inducing current flow in the nanoring structure.

EXPERIMENTAL EXAMPLES

The following examples are provided to more fully illustrate some of the embodiments disclosed hereinabove. It should be appreciated by those of ordinary skill in the art that the methods disclosed in the examples that follow represent techniques that constitute illustrative modes for practice of the disclosure. Those of ordinary skill in the art should, in light of the present disclosure, appreciate that many changes can be made in the specific embodiments that are disclosed and still obtain a like or similar result without departing from the spirit and scope of the disclosure.

Example 1: Synthesis of Copper Nanorings. In a typical procedure for synthesizing copper nanorings, a mixture containing 5 mL of PVA solution (3 wt. %) and 15 mL NMP was prepared and transferred to a Teflon-lined autoclave having a 25 mL capacity. Thereafter, 0.1 g CuCl (1 mmol) was added to the solution in the autoclave. After a period of sufficient stirring, the autoclave was sealed and heating was conducted at 210° C. for 48 hours. The solution was then cooled to room temperature to produce a brown solution containing a reddish solid. The solution was filtered and then washed with sufficient water and NMP to remove any unreacted CuCl. The resulting solid was then dried or re-dispersed in ethyl alcohol. Integrity of the copper nanoring structures was maintained. Synthesis of the copper nanoring structures was typically accompanied by primary production of copper nanowires.

When the amount of CuCl was reduced to 0.1 mmol and the PVA solution was diluted to 0.5-1 wt. %, keeping all other reagent quantities and ratios constant, synthesis of copper nanorings was significantly or completely suppressed. Similarly, failure to include water in the reaction solution significantly or completely suppressed the formation of copper nanorings. Likewise, in the present copper nanoring synthesis, substitution of 2-pyrrolidone or 1-vinyl-2-pyrrolidone for NMP suppressed the formation of copper nanorings. As previously noted, higher temperatures favored the production of copper nanorings, albeit with larger diameters.

Example 2: Characterization of Copper Nanorings. Physical characterization of the copper nanorings was accomplished by X-ray diffraction (XRD), energy dispersive X-ray spectroscopy (EDX), scanning electron microscopy (SEM), transmission electron microscopy (TEM) and selected area electron diffraction (SAED).

Figure 4:
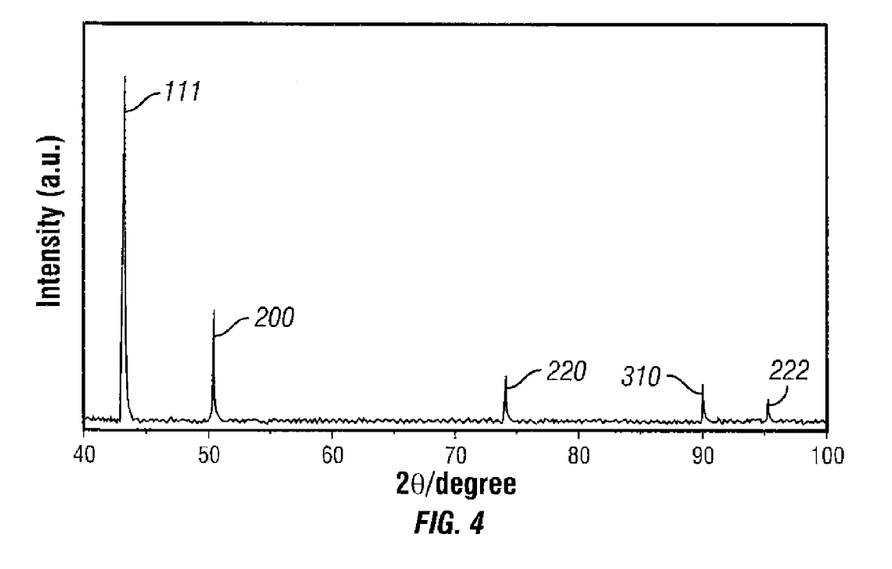
FIG. 4 shows an illustrative XRD pattern of single-crystalline copper nanorings.
Figure 5:
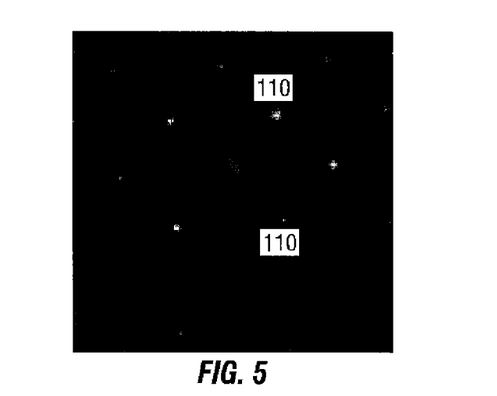
FIG. 5 shows an illustrative SAED pattern of single-crystalline copper nanorings.

XRD and SAED were used to confirm the single-crystalline nature of the copper nanorings. FIG. 4 shows an illustrative XRD pattern of the single-crystalline copper nanorings. The XRD pattern of FIG. 4 is consistent with that of cubic copper with a face-centered structure. FIG. 5 shows an illustrative SAED pattern of the single-crystalline copper nanorings. The SAED pattern is again consistent with a single-crystalline product.

Figure 6A:
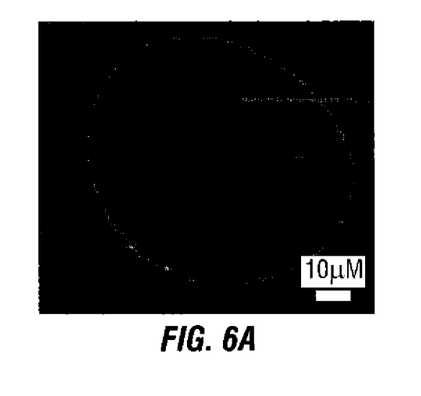
FIGS. 6A and 6B show illustrative SEM images on a silicon substrate of single-crystalline copper nanorings.
Figure 6B:
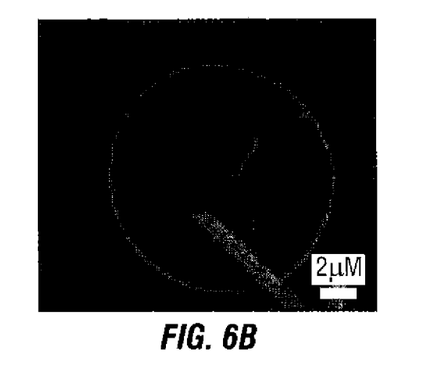
Figure 7:
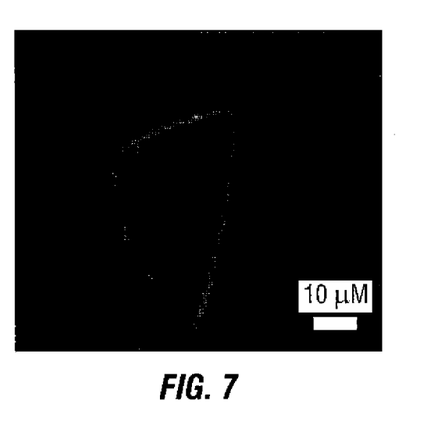
FIG. 7 shows an illustrative SEM image on a silicon substrate of a single-crystalline copper nanoring having an irregular-shaped closed-loop structure.

Illustrative SEM images of the copper nanorings on a vertically-aligned carbon nanotube substrate were previously shown in FIGURES IA and 1B. An alternative view of the copper nanorings is shown in FIGS. 6A and 6B and FIG. 7 along the longitudinal axis of the nanorings. FIGS. 6A and 6B show illustrative SEM images on a silicon substrate of single-crystalline copper nanorings. FIG. 7 shows an illustrative SEM image on a silicon substrate of a single-crystalline copper nanoring having an irregular-shaped closed-loop structure. Average copper nanoring diameters obtained from the SEM images commonly ranged from 15-40 μm, although both larger and smaller diameters were routinely observed.

Figure 8A:
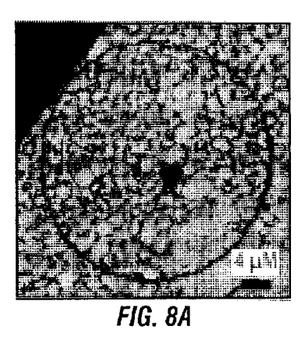
FIG. 8A shows an illustrative TEM image of a single-crystalline copper nanoring.
Figure 8B:
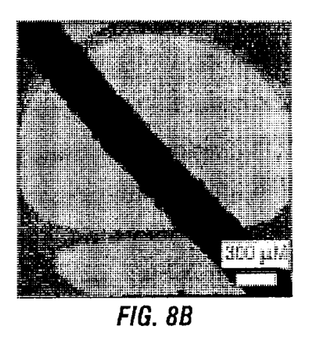
FIG. 8B presents a local magnification from the TEM image of FIG. 8A showing a segment of the single-crystalline copper nanoring structure.

TEM images showed comparable images of the copper nanoring structure. FIG. 8A shows an illustrative TEM image of a single-crystalline copper nanoring. FIG. 8B presents a local magnification from the TEM image of FIG. 8A showing a segment of the single-crystalline copper nanoring structure.

Figure 9:
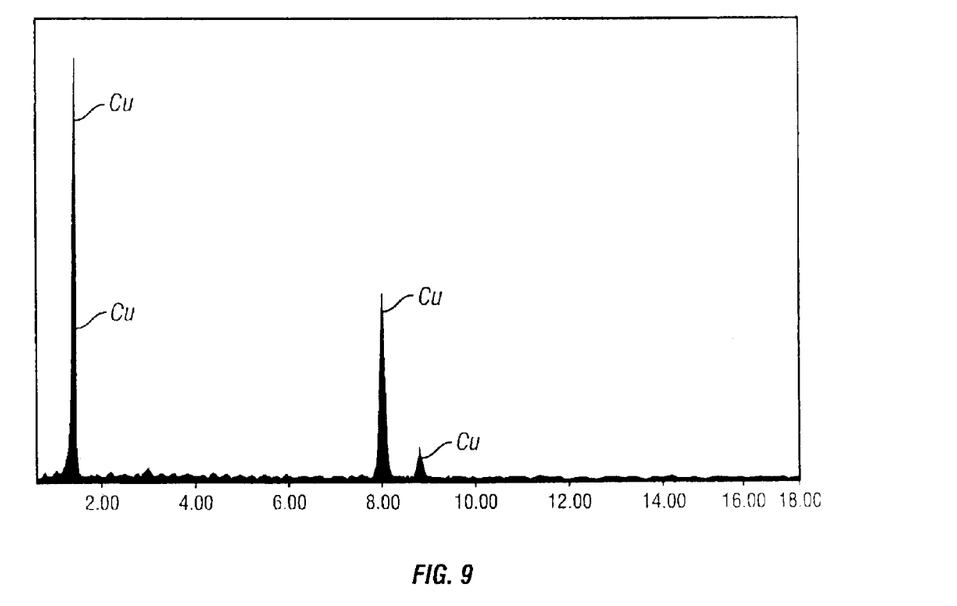
FIG. 9 shows an illustrative EDX spectrum of single-crystalline copper nanorings.

EDX spectroscopy was used to confirm the metallic nature of the copper nanorings. FIG. 9 shows an illustrative EDX spectrum of the single-crystalline copper nanorings. As shown in FIG. 9, only X-ray signatures for copper were observed in the EDX spectrum, indicating the reduction of Cu (I) into copper metal.

Example 3: Mechanical Characterization of Copper Nanorings. Mechanical characterization of the copper nanorings was accomplished using a nanomechanical device described in commonly-assigned U.S. patent application Ser. No. 12/607,550. Mechanical characterization using the nanomechanical device revealed that the copper nanorings had a stiffness of ~2300 N/m.

From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure, which is defined in the following claims.

What is claimed is the following:

1. A method for synthesizing zero-valent metal nanorings, said method comprising:
   providing a solution comprising:
   a) a metal cation;
   b) a complexing agent bound to the metal cation;
      wherein the complexing agent makes the metal cation at least partially soluble in the solution; and
   c) a reducing agent operable for reducing the metal cation to a zero-valent metal; and heating the solution for a sufficient time and at a sufficient temperature until zero-valent metal nanorings form,
      wherein the sufficient temperature is between about 180° C. and about 210° C.

2. The method of claim 1, wherein the zero-valent metal nanorings are single-crystalline.

3. The method of claim 1, wherein the solution further comprises water.

4. The method of claim 1, wherein the zero-valent metal nanorings are copper nanorings.

5. The method of claim 4, wherein the metal cation comprises a Cu (I) salt.

6. The method of claim 5, wherein the Cu (I) salt comprises CuCl.

7. The method of claim 4, wherein the metal cation is a Cu (I) salt, the complexing agent is N-methyl pyrrolidone (NMP) and the reducing agent is poly(vinyl alcohol) (PVA).

8. The method of claim 1, wherein the complexing agent is NMP.

9. The method of claim 1, wherein the reducing agent is PVA.

10. The method of claim 1, wherein the reducing agent is operable for reducing the metal cation to a zero-valent metal upon heating the solution.

11. The method of claim 1, wherein the sufficient time is less than about 7 days.

12. A solvothermal method for synthesizing single-crystalline zero-valent metal nanorings, said method comprising:
   providing an aqueous solution comprising:
   a) water;
   b) a metal cation;
   c) a complexing agent bound to the metal cation, comprising a metal complex that is at least partially soluble in the solution; and
   d) a reducing agent operable for reducing the metal complex to a zero-valent metal upon being heated; and
   heating the aqueous solution for a sufficient time and at a sufficient temperature until single-crystalline zero-valent metal nanorings form;
      wherein reduction of the metal complex takes place during at least a portion of the time that heating occurs, and
      wherein the sufficient temperature is between about 180° C. and about 210° C.

13. The method of claim 12, wherein the metal cation is a monovalent transition metal cation.

14. The method of claim 12, wherein the single-crystalline zero-valent metal nanorings are copper nanorings.

15. The method of claim 14, wherein the metal cation comprises a Cu (I) salt.

16. The method of claim 15, wherein the Cu (I) salt is CuCl.

17. The method of claim 16, wherein the reducing agent is PVA.

18. The method of claim 16, wherein the complexing agent is NMP.

19. The method of claim 14, wherein the metal cation is a Cu (I) salt, the complexing agent is NMP and the reducing agent is PVA.

20. The method of claim 12, wherein the sufficient time is less than about 7 days.

21. A solvothermal method for synthesizing single-crystalline copper nanorings, said method comprising:
   providing an aqueous solution comprising:
   a) water;
   b) a Cu (I) salt comprising a Cu (I) cation;
   c) NMP complexed to the Cu (I) cation to form a Cu (I)-NMP complex that is at least partially soluble in the aqueous solution; and
   d) a reducing agent operable for reducing the Cu (I)-NMP complex to copper metal upon being heated; and
   heating the aqueous solution for a sufficient time and at a sufficient temperature until single-crystalline copper nanorings form;
      wherein reduction of the Cu (I)-NMP complex takes place during at least a portion of the time that heating occurs, and
      wherein the sufficient temperature is between about 180° C. and about 210° C.

22. The method of claim 21, wherein the single-crystalline copper nanorings have a diameter of less than about 100 μm.

23. The method of claim 21, wherein the sufficient time is less than about 7 days.

24. The method of claim 21, wherein the reducing agent is PVA.

* * * * *